(12) United States Patent
Matsuda et al.

(10) Patent No.: US 6,339,337 B1
(45) Date of Patent: *Jan. 15, 2002

(54) METHOD FOR INSPECTING SEMICONDUCTOR CHIP BONDING PADS USING INFRARED RAYS

(75) Inventors: Shuichi Matsuda; Keiichiro Kata; Ryoji Sato; Masaharu Sato, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/048,045

(22) Filed: Mar. 26, 1998

(30) Foreign Application Priority Data

Mar. 27, 1997 (JP) ............................................. 9-091342

(51) Int. Cl.⁷ .............................................. G01R 31/02
(52) U.S. Cl. ..................................................... 324/752
(58) Field of Search ................................. 324/750, 751, 324/752, 753, 765; 250/339.04; 356/43, 432; 348/86–90, 126; 382/145, 149, 150, 141

(56) References Cited

U.S. PATENT DOCUMENTS

| 4,841,150 A | * | 6/1989 | Walter | 250/339 |
| 5,406,213 A | * | 4/1995 | Henley | 324/753 |
| 5,493,236 A | * | 2/1996 | Ishii et al. | 324/752 |
| 5,532,607 A | * | 7/1996 | Inuzuka et al. | 324/750 |
| 5,761,337 A | * | 6/1998 | Nishimura et al. | 382/150 |

FOREIGN PATENT DOCUMENTS

| JP | 5-235136 | 9/1903 |
| JP | 61-144837 | 7/1986 |
| JP | 62-188233 | 8/1987 |
| JP | 5-152401 | 6/1993 |
| JP | 5-160229 | 6/1993 |

OTHER PUBLICATIONS

A D Trigg, "The Infrared Photoemission Microscope as a Tool for Semiconductor Device Failure Analysis", 1997 IEEE, Proceedings of 6th IPFA, Singapore, pp.21–26.*

* cited by examiner

Primary Examiner—Vinh P. Nguyen
(74) Attorney, Agent, or Firm—Foley & Lardner

(57) ABSTRACT

An infrared ray test for a semiconductor chip is conducted by irradiating infrared ray onto a bottom surface of a semiconductor chip, receiving the infrared ray reflected from a bonding pad and displaying the image of the bonding pad on a monitor. The image obtained from the infrared ray has information whether the bonding pad itself or a portion of the silicon substrate underlying the bonding pad has a defect or whether or not there is a deviation of the bonding pad with respect to the bump.

9 Claims, 7 Drawing Sheets

(4 of 7 Drawing Sheet(s) Filed in Color)

FIG. 5

| SAMPLE GROUP | NUMBER OF SAMPLES | NUMBER OF DEFECTS/SAMPLES | | |
|---|---|---|---|---|
| | | AFTER BONDING | 100 CYCLES | 2000 CYCLES |
| #1 | 14 | 10/14 | 1/4 | 0/3 |
| #2 | 13 | 7/13 | 5/6 | 1/1 |
| #3 | 4 | 2/4 | 0/2 | 0/2 |
| #4 | 6 | 0/6 | 0/6 | 0/6 |
| #5 | 7 | 0/7 | 0/7 | 0/7 |

METHOD FOR INSPECTING SEMICONDUCTOR CHIP BONDING PADS USING INFRARED RAYS

BACKGROUND OF THE INVENTION (a) Field of the Invention

The present invention relates to a test method for a bonding pad on a semiconductor device and, more particularly, to a test method for examining the bonding pads by infrared ray.

(b) Description of the Related Art

A plurality of semiconductor chips formed on a silicon wafer are separated from one another, and subjected to die-bonding onto a package for mounting. Thereafter, the bonding pads on the semiconductor chip are connected to external leads. Current connection techniques in the semiconductor device are classified into two categories including a wire bonding technique and a wireless bonding technique.

In the wire bonding technique, the bonding pads on the chip are sequentially connected to the terminals of the external leads by bonding wires having a diameter as small as 20 to 30 $\mu$m. In the wireless bonding technique, all of the bonding pads are connected to terminals on the package by bumps in a single step.

By using the wireless bonding technique, the connection for the bonding pads can be conducted in a single bonding step irrespective of the number of the bonding pads during the mounting process, although the process for the wafer includes complicated steps such as fabrication of bumps. In addition, the semiconductor chip can be packaged in a small size, which is especially suited to a multi-chip module. The wireless bonding technique includes flip-chip bonding, beam-lead bonding, tape carrier bonding, etc.

With the advance of miniaturization technique for LSIs, the thickness of interconnects formed on a chip is generally reduced as well as the thickness of the bonding pads. For example, the thickness of the current bonding pads is as small as 0.6 $\mu$m down from the previous thickness of 1 $\mu$m. The smaller thickness of the bonding pads is likely to involve damages on the bonding pads or the underlying silicon substrate during the bonding step.

In the wire bonding technique, the damage to the bonding pads can be observed during the bonding step from outside the chip due to the arrangement of the bonding pads, which enables the products having damaged bonding pads to be rejected after the bonding step. However, small amounts of damage formed on the boundary between the bonding pads and the bonding wires cannot be observed from outside the chip. The small damage which is not observed during the bonding step may grow to a larger damage which is, which causes connection faults due to thermal stress during mounting of the resultant package onto a circuit board.

In the wireless bonding technique, such as flip-chip bonding technique, the bonding pads cannot be observed during the bonding step due to the arrangement of the bonding pads being covered by the silicon substrate. As a result, the products having damaged bonding pads cannot be rejected after the bonding step.

SUMMARY OF THE INVENTION

It is therefore an object of the present invention to provide a method for testing a bonding pad on a semiconductor chip in a nondestructive process by detecting the damages on the bonding pads which may cause a connection fault in the resultant semiconductor device.

The present invention provides a method for testing a semiconductor chip having a bonding pad on a main surface of the semiconductor chip, the method comprising the steps of irradiating infrared ray onto a bottom surface of the semiconductor chip, receiving the infrared ray reflected from the bonding pad at a photo-sensor, forming an image of the bonding pad from the infrared ray received by the photo-sensor, judging a defect of the semiconductor device from the image of the bonding pad.

In accordance with the method of the present invention, the damages or defect on the bonding pad or on the interface between the bonding pad and the silicon surface or bump can be observed by the image on the monitor, which enables rejection of the semiconductor device having damaged bonding pad or the interface.

The above and other objects, features and advantages of the present invention will be more apparent from the following description, referring to the accompanying drawings.

BRIEF DESCRIPTION OF THE DRAWINGS

The patent or application files contains at least one drawing executed in color. Copies of this patent application publication with color drawings will be provided by the Office upon request and payment of the necessary fee.

FIG. 5 is a table for indicating the results of the tests according to the embodiment of the present invention;

DESCRIPTION OF THE PREFERRED EMBODIMENTS

Now, the present invention is more specifically described with reference to accompanying drawings.

Figure 1A:
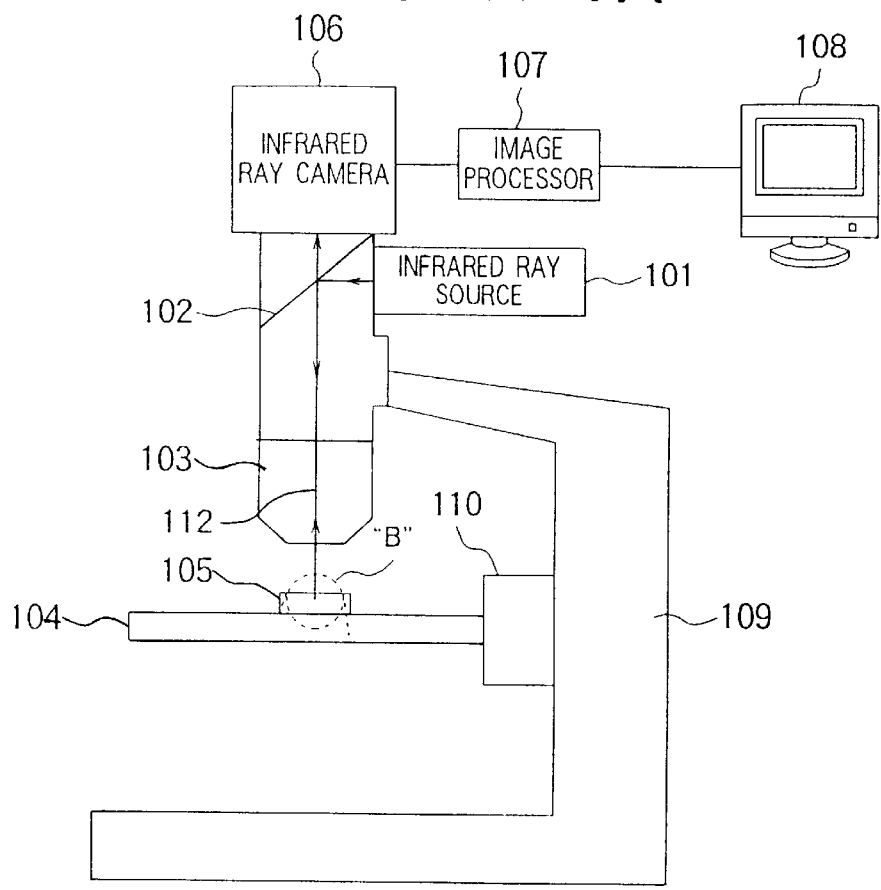
FIG. 1A is an infrared ray test system implementing a test method according to an embodiment of the present invention.

Referring to FIG. 1A, an infrared ray test system implementing a test method according to an embodiment of the present invention comprises an infrared ray source 101, an optical system for irradiating the infrared ray 112 toward a semiconductor chip 105 mounted on an X-Y stage 104 and passing the infrared ray 112 reflected from the semiconductor chip 105, and an imaging system for monitoring the image of the semiconductor chip 105 from the reflected infrared ray.

The optical system comprises a half mirror 102 for reflecting the infrared ray emitted by the infrared ray source 101 toward the semiconductor chip 105, an objective lens 103 for focusing the infrared ray 112 on a specified level of the semiconductor chip 105.

The imaging system comprises an infrared ray camera 106 receiving the infrared ray 112 reflected by the semiconductor chip 105 and passed by the optical system, an image processing unit 107 for processing the image data obtained by the infrared ray camera 106, and a monitor 108 for displaying the image processed by the image processing unit 107.

The X-Y stage 104 mounting the semiconductor chip 105 thereon is moved by a stage drive 110 in the vertical and horizontal directions on a stationary body 109, which also supports the optical system and the imaging system. The focus of the infrared ray 112 is adjusted by the vertical movement of the X-Y stage 104 so as to obtain a finer optical image for the specified level of the semiconductor chip 105 being displayed on the monitor 108.

Figure 1B:
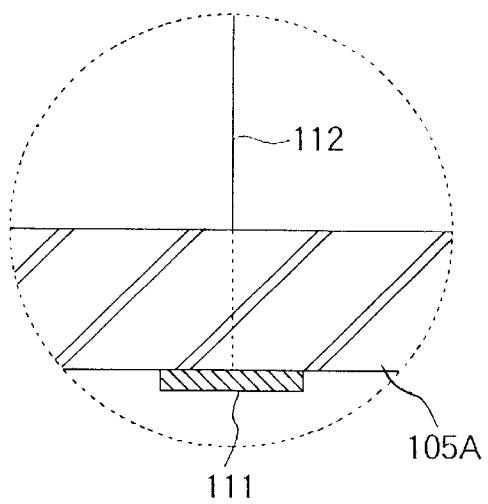
FIG. 1B is a magnified detailed view of a portion "B" in FIG. 1A.
Figure 1C:
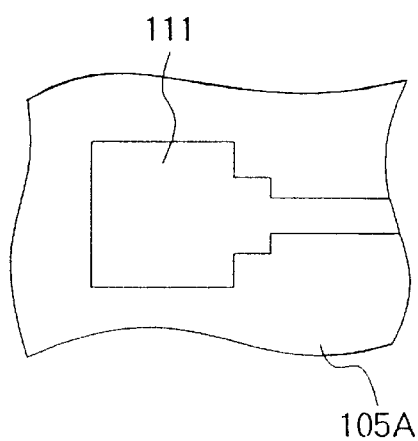
FIG. 1C is a top plan view of the bonding pad shown in FIG. 1B.

The semiconductor chip 105 is placed on the X-Y stage 104 with the main surface of the semiconductor chip 105 mounting the bonding pads 111 being directed downward, as shown in the detailed view of FIG. 1B. The infrared ray 112, which is incident on the bottom surface of the silicon substrate 105A, transmits through the silicon substrate 105A, and is reflected by the back surface of the bonding pads 111, which are made of aluminum and mounted on the main surface of the silicon substrate 105A as an interconnect pattern. The reflected infrared ray 112 again transmits through the silicon substrate 105, passes through the optical system and is incident on the infrared ray camera 106. The planar pattern of the bonding pads 111, such as shown in FIG. 1C, is then derived from the image of the infrared ray camera 106 by the image processing unit 107 and displayed on the monitor 108.

In the above configuration, wherein the optical axes of the irradiated infrared ray and the reflected infrared ray are designed to be identical, the angular adjustment of the optical system is simplified. The infrared ray source and the optical system may be replaced by a microscope having an infrared ray illumination which may have an infrared ray camera, wherein the objective lens may be such for a dedicated use in focusing the infrared ray.

If there is a non-uniformity or damage on the boundary between the bonding pad 111 and the silicon substrate 105A, the reflected infrared ray loses its uniformity and provides an abnormal image such as a dark area in the image of the bonding pad 111 displayed on the monitor 108.

Figure 2A:
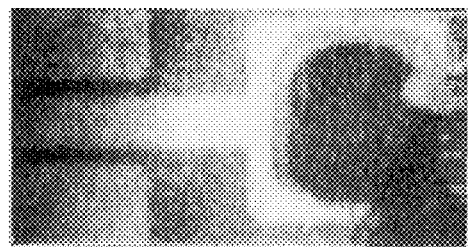
FIGS. 2A to 2F show practical examples of images displayed on the monitor shown in FIG. 1A.
Figure 2B:
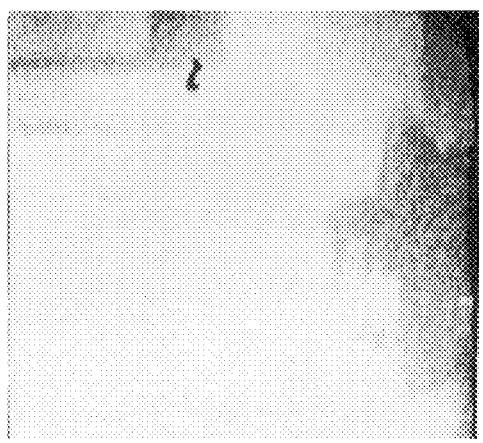
Figure 2C:
Figure 2D:
Figure 2E:
Figure 2F:
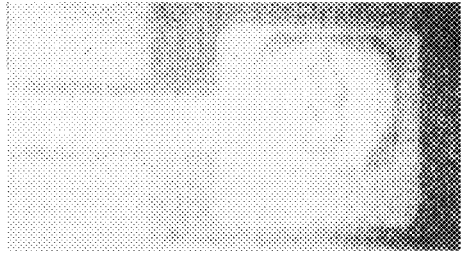
Figure 3A:
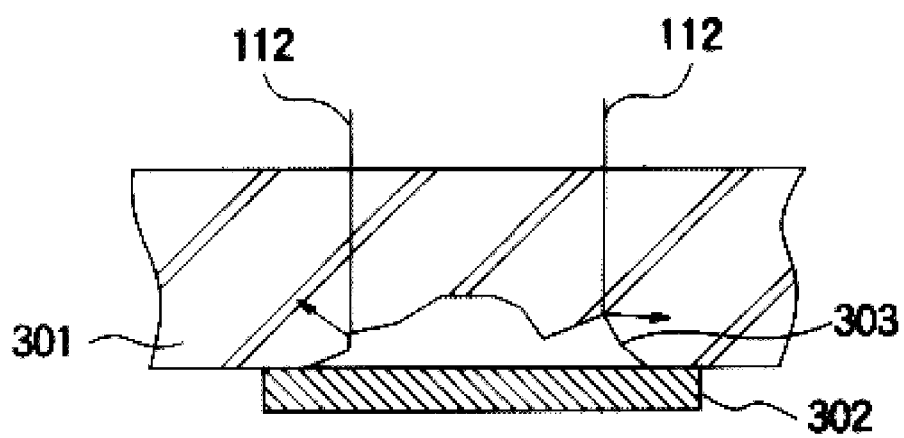
FIG. 3A is a cross-sectional view of a semiconductor chip showing a crack on a portion of a silicon substrate underlying the bonding pad and providing the image of FIG. 2A.
Figure 3B:
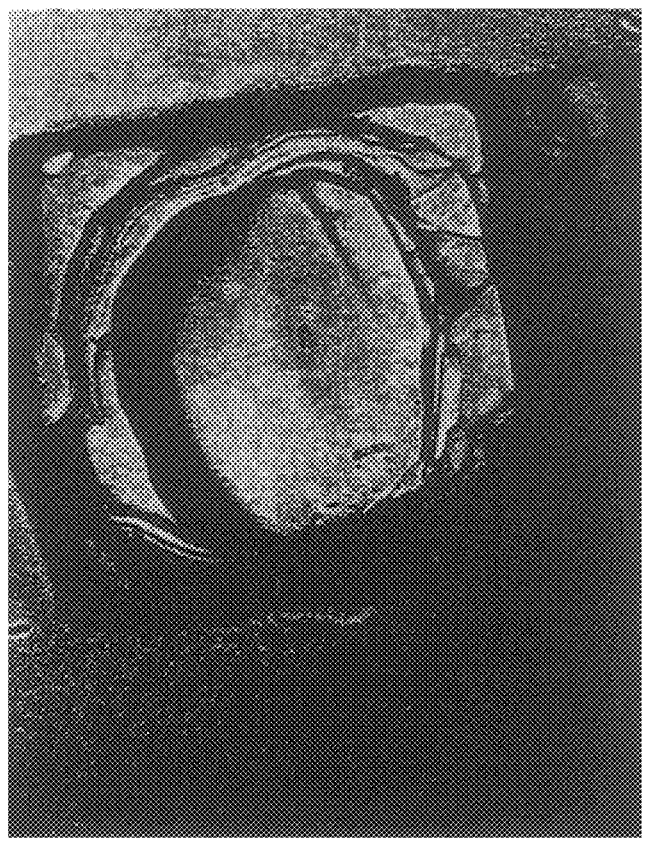
FIG. 3B shows a practical image of the crack of FIG. 3A after removing the bonding pad.

FIGS. 2A to 2F show examples of the observed abnormal images displayed on the monitor 108. FIGS. 2A to 2D show the presence of some cracks in a portion of the silicon substrate 105 underlying the bonding pads 111, whereas FIGS. 2E and 2F show the presence of some cracks in the bonding pads themselves. Specifically, FIG. 2A corresponds to the state shown in FIG. 3A, wherein a crack 303 was formed in the silicon substrate 301 at the interface between the same and the bonding pad 302. The infrared ray 112 is scattered by the surface of the crack 303 to provide a dark area. FIG. 3B shows the planar image of the cracks 303 shown in FIG. 3A, observed by the monitor after the bonding pad 302 is removed by aqua regia. In the image shown in FIG. 2A, the damage of the silicon body 301 below the bonding pad 302, as shown in FIG. 3A, provides a dark area in the whole damaged portion of the silicon substrate 105A.

FIGS. 2B to 2D show presence of defects known as "chipping" wherein the edge of the semiconductor chip is broken off. The chipping is generally caused by dicing of the wafer for separation thereof into a plurality of chips.

Figure 4A:
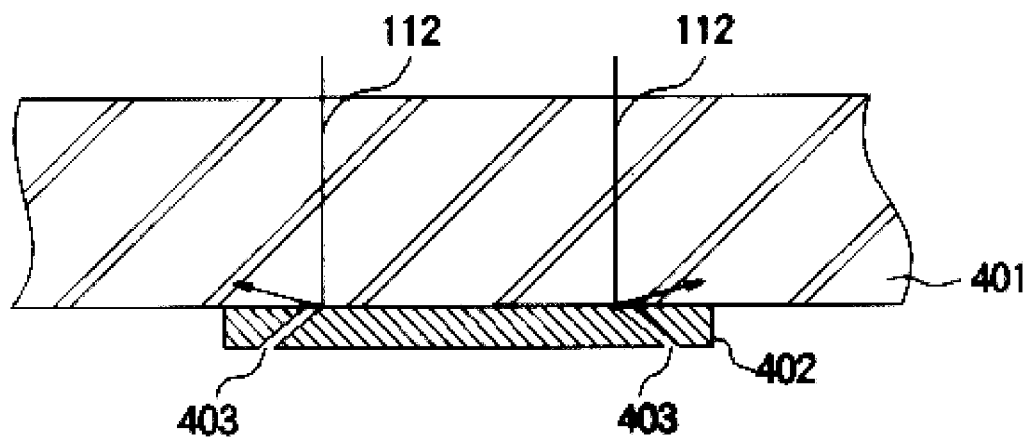
FIG. 4A is a cross-sectional view of a semiconductor chip for showing a crack in the bonding pad providing the image of FIG. 2E or 2F.
Figure 4B:
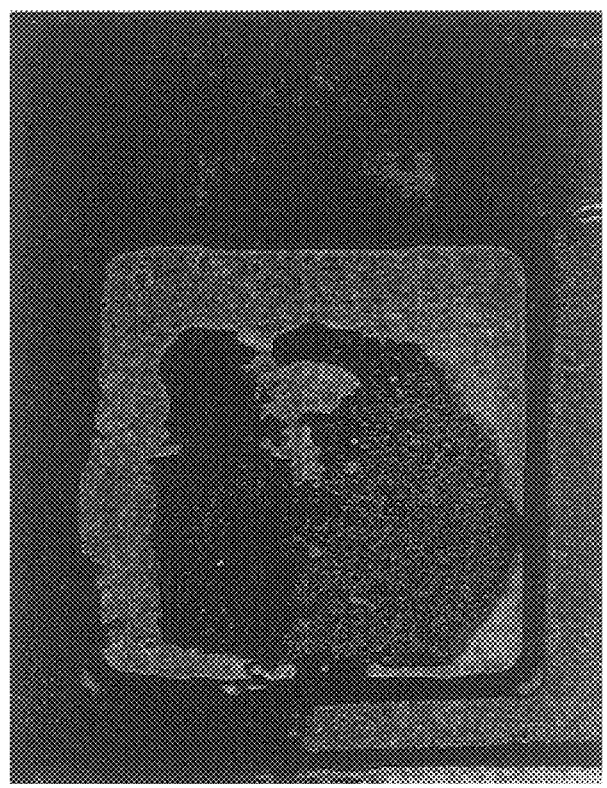
FIG. 4B shows a practical image of the crack of FIG. 4A after removing a surface portion of the bonding pad.

FIGS. 2E and 2F show the presence of cracks in the bonding pads themselves, such as cracks 403 formed in the bonding pads 402, such as shown in FIG. 4A. The infrared ray 112 is scattered by the surface of the cracks 403 in the bonding pad 402 formed on a silicon substrate 401 to provide a dark line in the image on the monitor. FIG. 4B shows the image of the bonding pad of FIG. 4A after a surface portion of the bonding pad was removed by aqua regia. As shown in FIG. 4B, a dark area was observed showing the presence of the defect wherein the bonding pad was entirely removed after the removal of the surface portion thereof. In FIGS. 2E and 2F, the crack exhibiting an irregular reflection can be observed on the monitor by dark lines in the bonding pad.

Although the abnormal or non-uniform images on the monitor show the damages formed on the bonding pad or on the boundary, as described above, all of the observed abnormal image does not necessarily lead to critical defects in the resultant semiconductor device. For example, in the abnormal image shown in FIG. 2E, if the area encircled by the dark line occupies less than ¼ of the total area of the bonding pad, the bonding pad is likely to have a sufficient reliability in the total life of the semiconductor device. On the other hand, FIG. 2A shows a critical defect in the semiconductor device, wherein the defect is observed as the dark area.

FIG. 5 shows the results of the reliability test for the sample semiconductor devices each having an abnormal portion such as shown in FIGS. 2A, 2E and 2F. The first sample group (#1) including 14 samples had abnormal dark areas such as shown in FIG. 2A, second to fourth (#2 to #4) sample groups had abnormal images such as shown in FIG. 2E, wherein a normal bright area is encircled by a closed dark line, and fifth (#5) sample group had an abnormal image such as shown in FIG. 2F, wherein a dark line is observed in the image of the bonding pad. Each of the second sample group (13 samples) had a large abnormal portion, or encircled bright area, which occupied an area greater than ¼ of the total area for the bonding pad, each of the third sample group (4 samples) had a medium abnormal portion which is equivalent to ¼ of the total area for the bonding pad, each of the fourth sample group (6 samples) had a small abnormal portion which is less ¼ of the total area for the bonding pad, and each of fifth sample group (7 samples) had an abnormal open dark line.

The reliability test was conducted after the bonding step and a subsequent step for subjecting the resultant chips to 100 and 2000 heat cycles each including the steps of applying −25° C. for 8 minutes, a room temperature for 2 minutes, 125° C. for 8 minutes and a room temperature for 2 minutes to the chips. The reliability test was effected by a normal electrical conduction test for passing or rejecting the semiconductor chips by absence or presence of an open circuit failure.

As shown in FIG. 5, the first through third sample groups included some rejected samples whereas the fourth and fifth sample groups included no rejected samples. From these results, it can be derived that a semiconductor chip having a bright area which is encircled by an abnormal dark line and occupies less than ¼ of the total area of the bonding pad and a semiconductor chip having an abnormal open dark line should pass the infrared ray test as the reliability test.

Figure 6A:
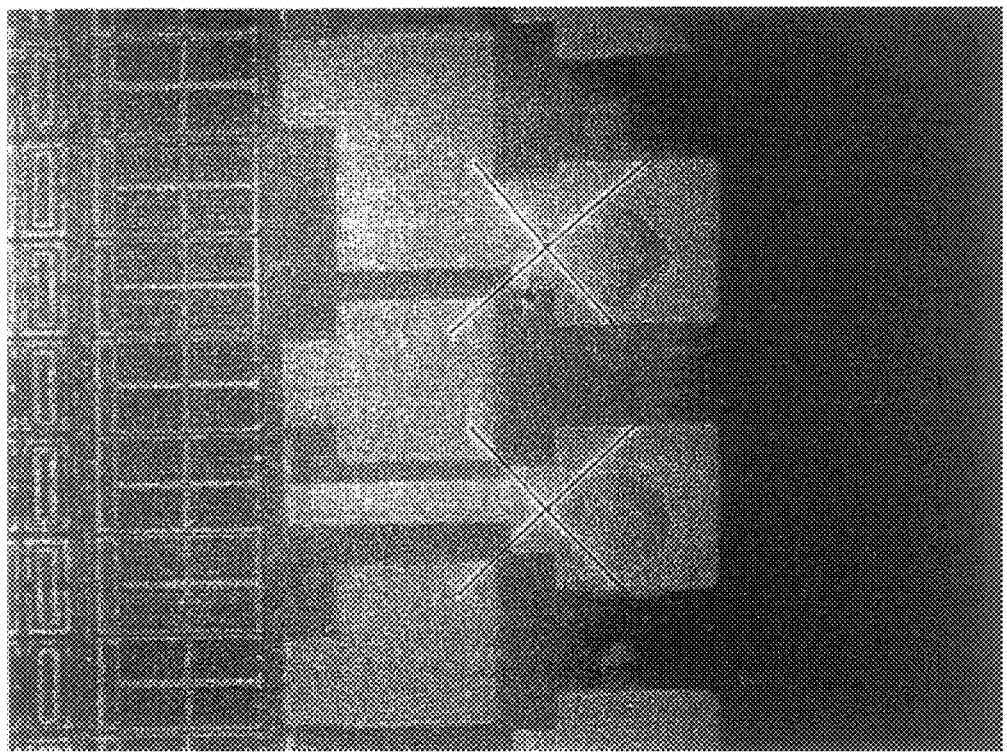
FIGS. 6A and 6B show images of defects generated in the bonding step for the bonding pads.
Figure 6B:
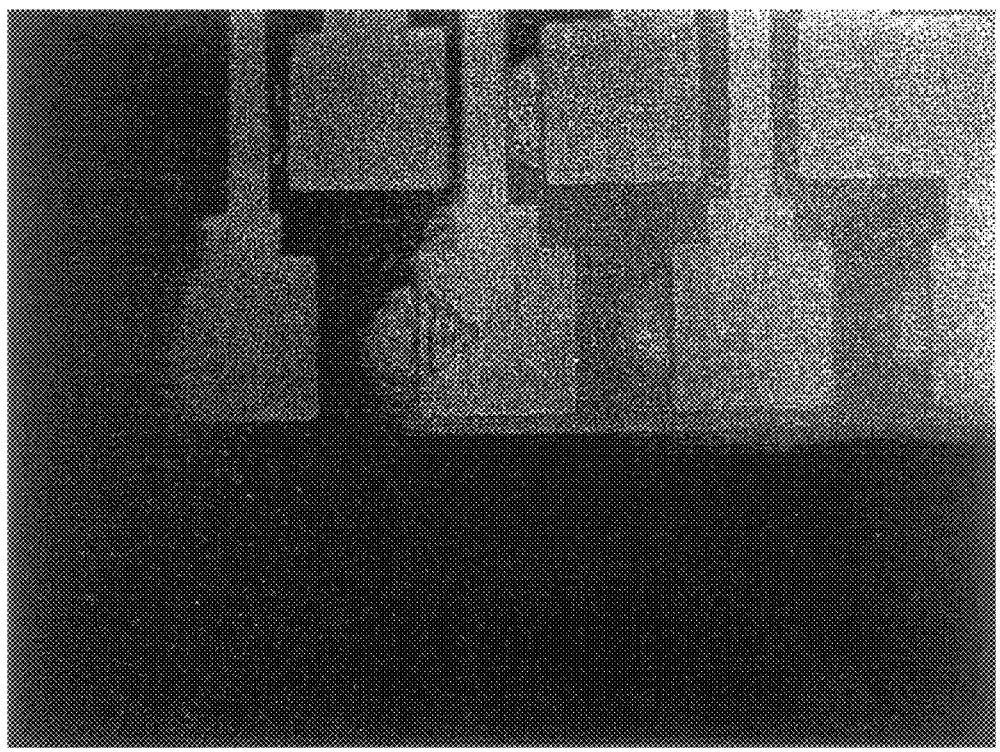
Figure 7A:
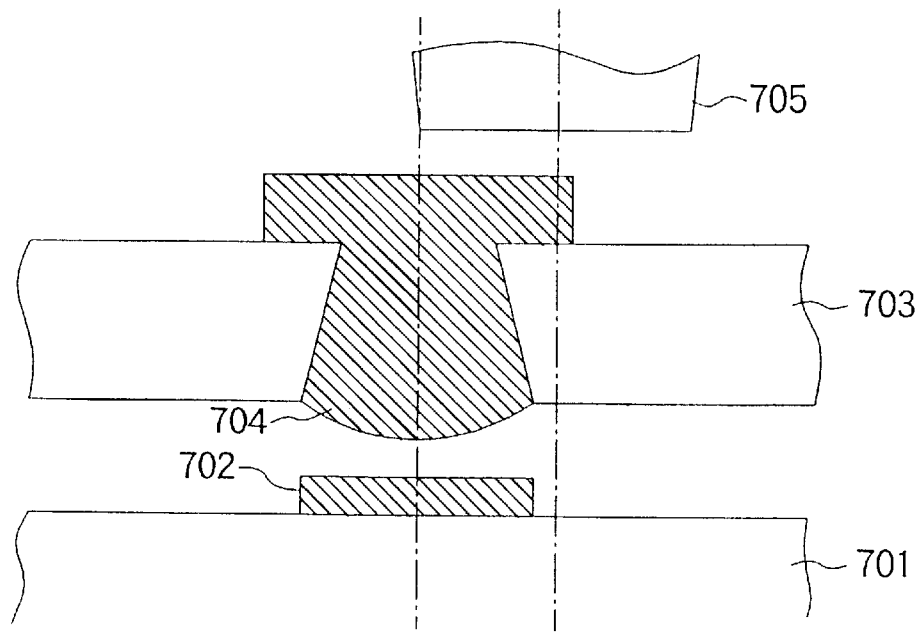
FIGS. 7A and 7B are cross-sectional views during bonding steps providing the images of FIGS. 6A and 6B, respectively.
Figure 7B:
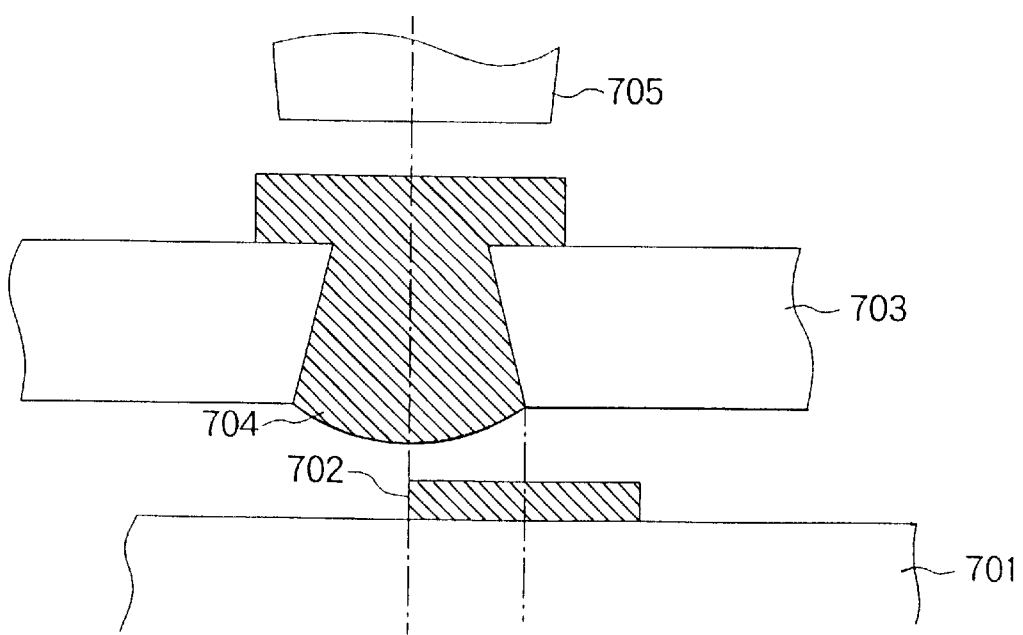

Some bonding pads have defects wherein the location of the bonding pads are deviated from correct positions (or bumps to be bonded thereto) or defects wherein the bonding tool is deviated from the correct position of the bonding operation. FIG. 6A shows the image on the monitor 108 revealing a stripe pattern in the image of the bonding pad, showing a defect wherein the bonding pads are not bonded uniformly to bumps due to the deviation of the bonding tool, the position of which is denoted by "X" in the figure. FIG. 6B shows the image on the monitor 108 revealing a bright area is deviated from the image of the bonding pad, showing a defect wherein the bonding pads are deviated from the correct position. FIGS. 7A and 7B, which correspond to FIGS. 6A and 6B, respectively, show a bonding step wherein a through-hole bump 704 formed on a carrier tape 703 is bonded onto a bonding pad 702 formed on the silicon substrate 701 by pressing a bonding tool 705 against the bottom surface of the bump 704.

In FIG. 7A, the bonding tool 705 is deviated from the correct position at the bottom surface of the through-hole bump 704, which causes a non-uniform bonding to provide an abnormal image of the bonding pads on the monitor such as shown in FIG. 6A. In FIG. 7B, the bonding pad 702 is deviated from the through-hole bump 704, which provides an abnormal image on the monitor such as shown in FIG. 6B.

If the deviated amount of the bonding tool 705 is 40 µm or more in FIG. 7A, resultant bonded pad involves a critical defect in the bonding interface. The infrared ray test can hardly provide the exact size of the deviation. Accordingly, if an abnormal area such as shown in FIG. 6A is observed on the monitor for revealing the mere presence of the deviation, it is judged that the resultant bonding interface has a critical defect.

If the deviated amount of the bonding pad from the bump is 25 µm or more, the resultant bonded pad involves a critical defect in the interface. If a bright image deviated from the bonding pad is observed, such as shown in FIG. 7B, the deviation is considered to be more than about 25 µm and the product is rejected as having a critical defect.

What is claimed is:

1. A method for testing a semiconductor chip having a bonding pad on a main surface of the semiconductor chip, said method comprising the steps of:

irradiating an infrared ray through a bottom surface of the semiconductor chip opposite to said main surface, passing the infrared ray through said semiconductor chip, reflecting the infrared ray from a surface of said bonding pad mounted to said semiconductor chip, receiving the infrared ray reflected from the bonding pad and passing again through said semiconductor chip at a photo-sensor, forming an image of the bonding pad based on a contrast in brightness and darkness of the reflected infrared ray within the bonding pad area received by the photo-sensor, and determining a defect of the semiconductor device from the image of the bonding pad.

2. A method as defined in claim 1, wherein said determining includes detecting an image including a bright area encircled by a dark line in the image of the bonding pad.

3. A method as defined in claim 2, wherein said determining is conducted by evaluating a ratio of the bright area encircled by the dark line to the total area of the image of the bonding pad.

4. A method as defined in claim 3, wherein said determining rejects the semiconductor chip by detecting the ratio of the encircled area above ¼ of the total area of the bonding pad.

5. A method as defined in claim 1, wherein said determining includes detecting a dark area in the image of the bonding pad.

6. A method as defined in claim 1, wherein said determining includes detecting a stripe pattern in the image of the bonding pad.

7. A method as defined in claim 1, wherein said determining includes detecting an abnormal bright area deviated from the image of the bonding pad.

8. A method for testing a semiconductor chip as defined in claim 1, wherein an axis of said irradiated infrared ray is oriented in a perpendicular direction with respect to the bottom surface of the semiconductor chip and is substantially identical to an axis of said reflected infrared ray.

9. A method for testing a semiconductor chip as defined in claim 1, wherein said semiconductor chip is maintained at a room temperature.

* * * * *